(12) United States Patent
Chuang et al.

(10) Patent No.: US 10,971,609 B2
(45) Date of Patent: Apr. 6, 2021

(54) BACK END OF LINE NANOWIRE POWER SWITCH TRANSISTORS

(71) Applicant: Taiwan Semiconductor Manufacturing Co., Ltd., Hsinchu (TW)

(72) Inventors: Li-Yang Chuang, Hsinchu (TW); Ching-Wei Tsai, Hsinchu (TW); Wang-Chun Huang, Hsinchu (TW); Kuan-Lun Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/549,266

(22) Filed: Aug. 23, 2019

(65) Prior Publication Data
US 2021/0057559 A1 Feb. 25, 2021

(51) Int. Cl.
| | | |
|---|---|---|
| *H01L 29/775* | (2006.01) | |
| *H01L 23/522* | (2006.01) | |
| *H01L 29/06* | (2006.01) | |
| *H01L 21/02* | (2006.01) | |
| *H01L 29/66* | (2006.01) | |
| *H01L 21/306* | (2006.01) | |
| *H01L 21/311* | (2006.01) | |
| *H01L 21/768* | (2006.01) | |

(52) U.S. Cl.
CPC ........ *H01L 29/775* (2013.01); *H01L 21/0257* (2013.01); *H01L 21/02603* (2013.01); *H01L 21/30604* (2013.01); *H01L 21/31111* (2013.01); *H01L 21/76802* (2013.01); *H01L 21/76877* (2013.01); *H01L 23/5226* (2013.01); *H01L 29/0669* (2013.01); *H01L 29/66439* (2013.01)

(58) Field of Classification Search
CPC .......... H01L 23/5226; H01L 21/76802; H01L 21/76877; H01L 21/02603; H01L 27/2454
See application file for complete search history.

(56) References Cited

U.S. PATENT DOCUMENTS

2011/0012085 A1\* 1/2011 Deligianni .......... H01L 29/0676
257/9

\* cited by examiner

*Primary Examiner* — Changhyun Yi
(74) *Attorney, Agent, or Firm* — Sterne, Kessler, Goldstein & Fox P.L.L.C

(57) ABSTRACT

An integrated circuit (IC) structure with a nanowire power switch device and a method of forming the IC structure are disclosed. The method includes forming a first layer of metal lines of a first back end of line (BEOL) interconnect structure and forming a semiconductor nanowire structure on a first metal line of the first layer of metal lines. The BEOL interconnect structure is formed on a front end of line (FEOL) device layer having multiple active devices. The method further includes forming a first dielectric layer wrapped around the semiconductor nanowire structure, forming a metal layer on the dielectric layer and on a second metal line of the first layer of metal lines, and forming a second layer of metal lines of a second BEOL interconnect structure on the semiconductor nanowire structure. The first and second metal lines are electrically isolated from each other.

20 Claims, 9 Drawing Sheets

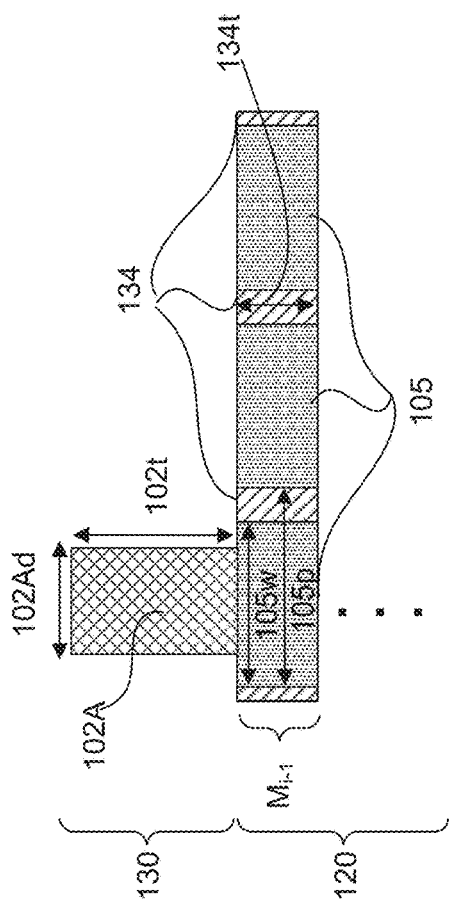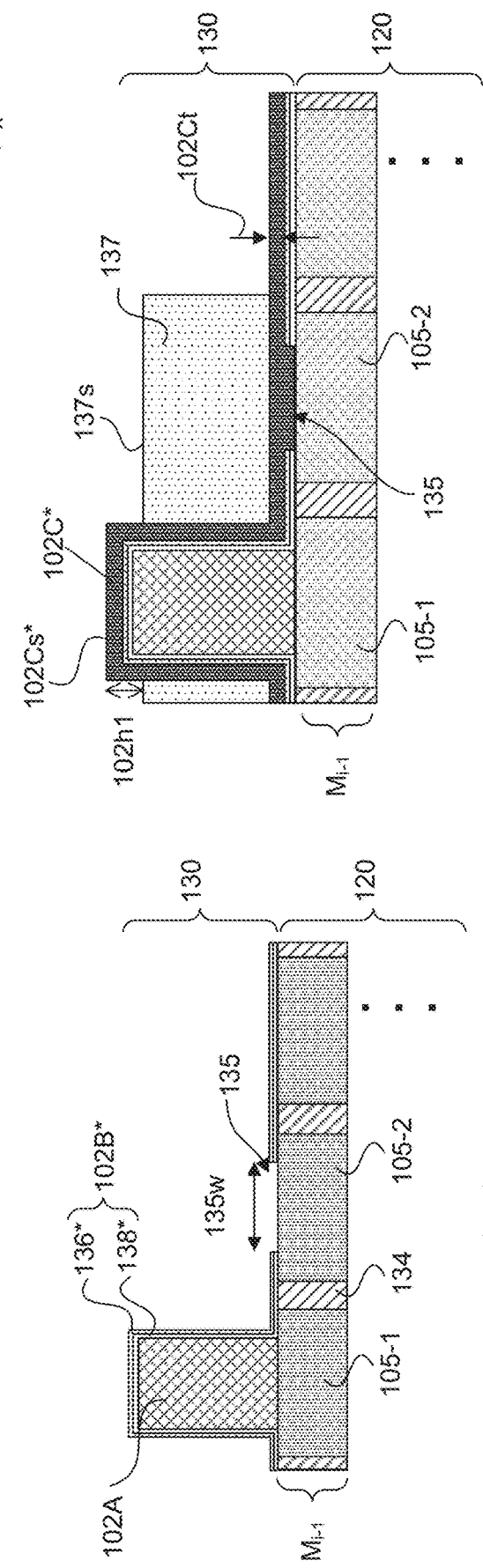

BACK END OF LINE NANOWIRE POWER SWITCH TRANSISTORS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while IC component geometry size (e.g., the smallest component or line that can be created using a fabrication process) has decreased. This scaling process generally provides benefits by increasing production efficiency and lowering associated costs.

The area occupied by the IC components is near the surface of a semiconductor wafer. Although dramatic improvements in lithography have resulted in considerable improvement in two-dimensional (2D) integrated circuit formation, there are physical limitations to an achievable density in two dimensions. One of these limitations is the minimum size needed to make the IC components.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

FIGS. 4-8 illustrate cross-sectional views of an integrated circuit structure with a nanowire power switch device in an interconnect structure at various stages of its fabrication process, in accordance with some embodiments.

FIGS. 9A-11A and 9B-11B illustrate isometric views and cross-sectional views, respectively, of an integrated circuit structure with a nanowire power switch device in an interconnect structure at various stages of its fabrication process, in accordance with some embodiments.

DETAILED DESCRIPTION

Figure 1:
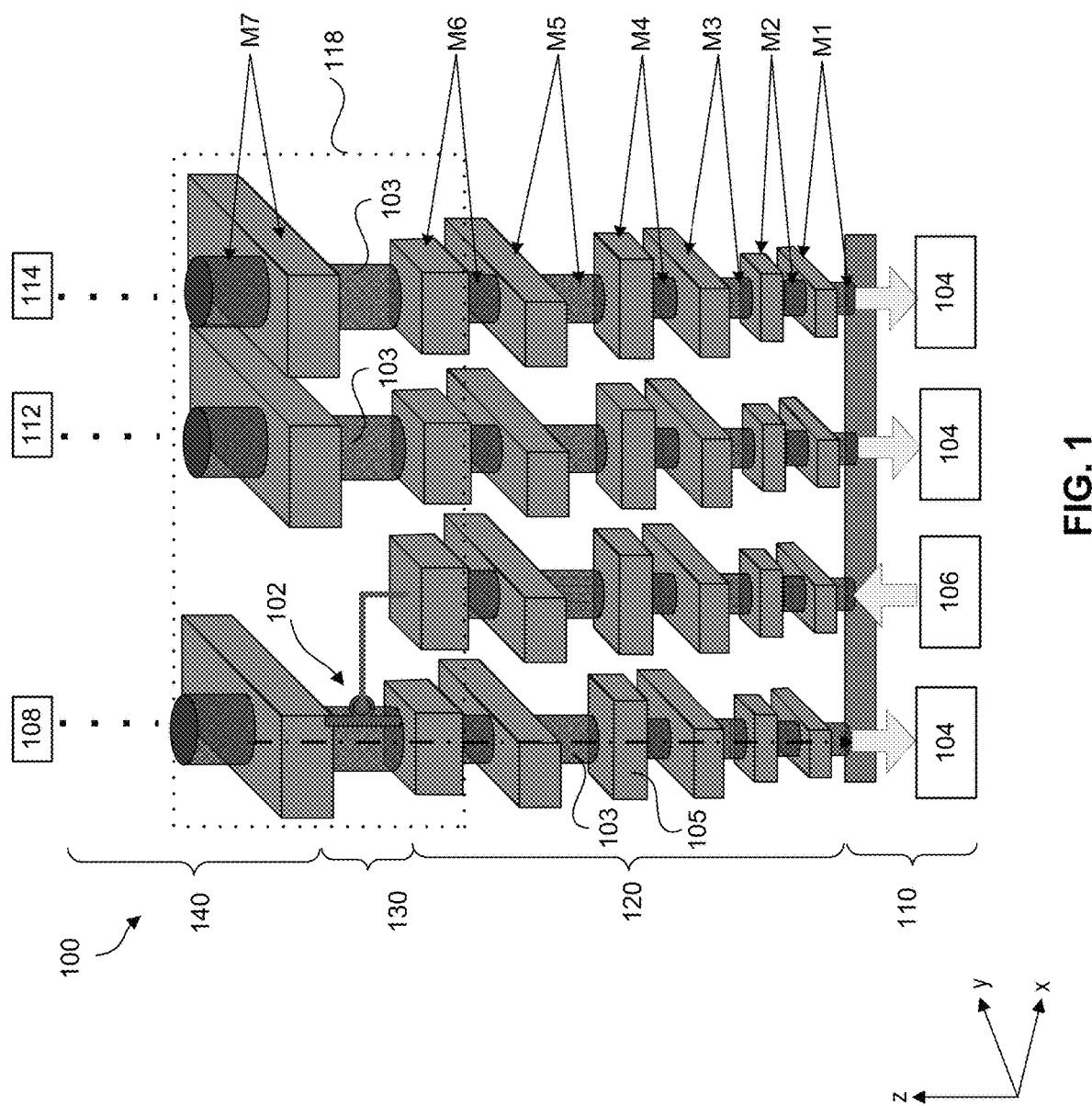
FIG. 1 illustrates an isometric view of an integrated circuit structure with a nanowire power switch device in an interconnect structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the term "nominal" refers to a desired or target value of a characteristic or parameter for a component or a process operation, set during the design phase of a product or a process, together with a range of values above and/or below the desired value. The range of values can be due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value).

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

In some embodiments, the term "FEOL portion" can refer to a portion of an integrated circuit (IC) structure that have structures (e.g., active devices, passive devices, source/drain contact structures, gate contact structures, etc.) fabricated on an IC wafer in the front end of line (FEOL) stage of IC fabrication.

In some embodiments, the term "MEOL portion" (also referred to as "MOL portion") can refer to a portion of an IC structure that have low-level interconnect structures (e.g., one or two layers of contacts and/or metal lines) fabricated on the FEOL portion in the middle end of line (MEOL) (also referred to as mid end of line (MOL)) stage of IC fabrication. The low level-interconnect structures can electrically connect device terminals (e.g., source/drain contact structures, gate contact structures, etc.) to higher level interconnects in back end of line (BEOL) portion of an IC structure.

In some embodiments, the term "BEOL portion" can refer to a portion of an IC structure that have high-level interconnect structures (e.g., metal lines, vias, etc.) fabricated on the MEOL portion in the BEOL stage of IC fabrication.

Power gating can be used in design of IC structures to control the distribution of powers for IC components (e.g., devices or interconnect structures). Using power gating can enable devices that are not in use to be turned off to reduce leakage and power consumption. Power gating can be performed by, for example, one or more power switch devices. Power switch devices can be transistor devices (e.g., field effect transistor (FET) devices) integrated in FEOL portion of the IC structure and can occupy about 3% to about 5% (e.g., about 3%, about 4%, or about 5%) of the device area in the FEOL portion. As high performance is not required of power switch devices as other logic devices in the FEOL portion, integrating the power switch devices in another portion of the IC structures, such as the BEOL portion can increase logic device density in the FEOL portion.

Additionally, power switch devices in the FEOL portion can be susceptible to short channel effects (e.g., decrease of sub-threshold swing and/or increase of drain induced barrier lowering (DIBL)) due to scaling down of the IC structure geometry size. Integrating the power switch devices in another portion of the IC structures, such as the BEOL portion can reduce leakage current, thus reducing power consumption.

The present disclosure provides example IC structures with nanowire power switch devices in BEOL interconnect structures and example methods of fabricating the same. In some embodiments, an IC structure can include first and second interconnect structures and a nanowire power switch device interposed between the first and second interconnect structures. The first interconnect structure can be a BEOL interconnect structure in the BEOL portion, which can be electrically connected to a plurality of active devices (e.g., FET devices) in an FEOL device layer in the FEOL portion through low-level interconnect structures in the MEOL portion.

The nanowire power switch device can include a semiconductor nanowire structure, a dielectric layer wrapped around the semiconductor nanowire structure, and a metal layer disposed on the dielectric layer. The semiconductor nanowire structure and the metal layer can be electrically connected to different metal lines of the first interconnect structure. The second interconnect structure can be connected to a power source, which can provide power to the plurality of active devices through the semiconductor nanowire structure under the control of the metal layer.

Integrating the nanowire power switch devices in the BEOL interconnect structures can reduce power switch device areas in the FEOL portion, thus improving logic device density in the FEOL portion, in accordance with some embodiments. Also, short channel performance of the nanowire power switch devices can be improved without BEOL area penalty. Fast switching speed can also be achieved in the nanowire power switch devices because of the junctionless device formed with the semiconductor nanowire structure.

FIG. 1 is an isometric view of an IC structure 100 having a nanowire power switch device 102, in accordance with some embodiments. IC structure 100 can include an FEOL device layer 110 in the FEOL portion, a first BEOL interconnect structure 120 disposed on the FEOL device layer 110, a BEOL device layer 130 disposed on the first BEOL interconnect structure 120, and a second BEOL interconnect structure 140 disposed on the BEOL device layer 130. In some embodiments, IC structure 100 can further include an MEOL layer interposed between FEOL device layer 110 and first BEOL interconnect structure 120.

FEOL active device layer 110 can include a control device 106 configured to control nanowire power switch device 102 and a plurality of active devices 104, such as FET devices. First BEOL interconnect structure 120 can include multiple layers of vias 103 and metal lines 105. Vias 103 can connect metal lines 105 above and below via 103 in a Z-direction. Metal lines 105 can extend in an X- or Y-direction. Each adjacent via 103 and metal line 105 can form a conductive interconnect layer, for example, conductive interconnect layer M1-M6 as shown in FIG. 1, to electrically connect FEOL device layer 110 and BEOL device layer 130. Though first BEOL interconnect structure 120 in FIG. 1 includes six conductive interconnect layers, it can include any number of conductive interconnect layers.

Second BEOL interconnect structure 140 can include one or more conductive interconnect layers of vias 103 and metal lines 105 and can be electrically connected to a true power source (TVDD) 108, a gate power source (VGG) 112, and a ground (VSS) 114, which are electrically connected (not shown) to active devices 104. VGG 112 can be configured to provide gate power supply to active devices 104. VSS 114 can be configured to provide ground connection to active devices 104. Though second BEOL interconnect structure 140 in FIG. 1 includes one conductive interconnect layer M7, it can include any number of conductive interconnect layers.

BEOL device layer 130 can include nanowire power switch device 102 and vias 103, which can be electrically isolated from each other by dielectric layers (not shown). Nanowire power switch device 102 can be configured to control a virtual power source (VVDD) supply from true power source 108 to active devices 104. FIG. 1 illustrates that true power source 108 is electrically connected to nanowire power switch device 102 through second BEOL interconnect structure 140, and nanowire power switch device 102 is electrically connected to active devices 104 through first BEOL interconnect structure 120. Power gating signals from control device 106 can control nanowire power switch device 102 to turn on or turn off the virtual power source VVDD for active devices 104. When nanowire power switch device 102 is on, power supply from TVDD 108 can pass to nanowire power switch device 102 to provide VVDD to active devices 104. When nanowire power switch device 102 is off, power supply from TVDD 108 cannot pass to nanowire power switch device 102, and as a result, active devices 104 cannot receive VVDD power supply. Power gating signal can be a gate voltage (VG) applied to nanowire power switch device 102.

Figure 2A:
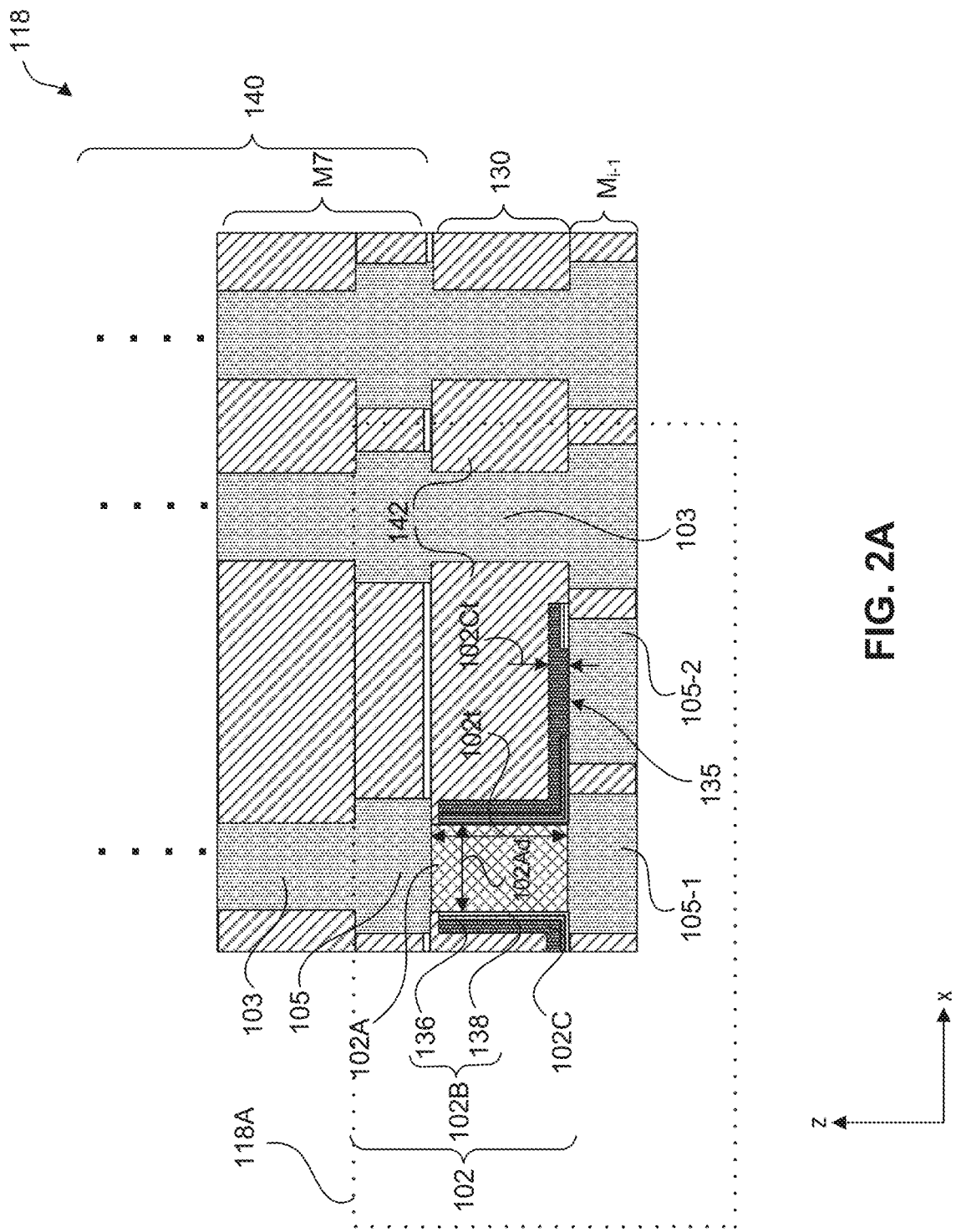
FIGS. 2A-2B illustrate cross-sectional views of a zoomed-in area of the integrated circuit structure of FIG. 1, in accordance with some embodiments.

FIG. 2A illustrates a cross-sectional view of a zoomed-in area 118 of IC structure 100 of FIG. 1, in accordance with some embodiments. Nanowire power switch device 102 can be formed in BEOL device layer 130 and over a layer $M_{i-1}$ of metal lines 105 of first BEOL interconnect structure 120 shown in FIG. 1. Layer $M_{i-1}$ can be part of one of the conductive interconnect layers of first BEOL interconnect structure 120 described above with reference to FIG. 1. Second BEOL interconnect structure 140 can be disposed on nanowire power switch device 102. Nanowire power switch device 102 can be electrically isolated from vias 103 in BEOL device layer 130 by dielectric layers 142. In some embodiments, nanowire power switch device 102 can include a semiconductor nanowire structure 102A, a dielectric layer 102B wrapped around semiconductor nanowire structure 102A, and a metal layer 102C disposed on dielectric layer 102B.

In some embodiments, semiconductor nanowire structure 102A can include polysilicon and/or silicon germanium ($Si_{1-x}Ge_x$), wherein value of x can be from zero to one. In some embodiments, semiconductor nanowire structure 102A can include undoped or doped $Si_{1-x}Ge_x$ material. In some embodiments, polysilicon and/or $Si_{1-x}Ge_x$ can be formed by deposition of amorphous Si and/or amorphous $Si_{1-x}Ge_x$, respectively, with in-situ doping followed by re-crystallization. The deposition of amorphous Si and/or amorphous $Si_{1-x}Ge_x$ can include chemical vapor deposition (CVD), physical vapor deposition (PVD), or other suitable deposition processes.

In some embodiments, semiconductor nanowire structure 102A can have one or more p-type dopant, for example, boron (B), aluminum (Al), and/or gallium (Ga). In some embodiments, semiconductor nanowire structure 102A can have one or more n-type dopants, for example, phosphorus (P), arsenic (As), and/or antimony (Sb). In some embodiments, semiconductor nanowire structure 102A can have a dopant concentration ranging from about $1 \times 10^{19}$ atoms/cm$^3$ to about $1 \times 10^{20}$ atoms/cm$^3$ (e.g., about $1 \times 10^{19}$ atoms/cm$^3$, about $3 \times 10^{19}$ atoms/cm$^3$, about $5 \times 10^{19}$ atoms/cm$^3$, about $8 \times 10^{19}$ atoms/cm$^3$, or about $1 \times 10^{20}$ atoms/cm$^3$). With such high doping concentration, the contact resistance between semiconductor nanowire structure 102A (e.g., Si or $Si_{1-x}Ge_x$ layer) and a first metal line 105-1 of layer $M_{i-1}$ can be reduced. Other materials, formation methods, and doping concentrations for semiconductor nanowire structure 102A are within the scope and spirit of this disclosure.

In some embodiments, semiconductor nanowire structure 102A can have a diameter 102Ad ranging from about 20 nm to about 30 nm (e.g., about 20 nm, about 25 nm, about 28 nm, or about 30 nm). Semiconductor nanowire structure 102A can have a vertical dimension 102t (e.g., height) along a Z-axis ranging from about 50 nm to about 60 nm (e.g., about 50 nm, about 53 nm, about 55 nm, about 58 nm, or about 60 nm). These ranges of dimensions of semiconductor nanowire structure 102A can be limited by the dimensions of the contact structures of underlying active devices 104 and/or vias 103.

Dielectric layer 102B can include silicon oxide and can be formed by CVD, PVD, atomic layer deposition (ALD), e-beam evaporation, or other suitable processes. In some embodiments, dielectric layer 102B can include (i) a layer of silicon oxide, silicon nitride, and/or silicon oxynitride, (ii) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers can be formed by ALD and/or other suitable methods.

In some embodiments, dielectric layer 102B can include a single layer or a stack of insulating material layers. In some embodiments, dielectric layer 102B can include an oxide layer 138 wrapped around semiconductor nanowire structure 102A and a high-k dielectric layer 136 disposed on oxide layer 138, according to some embodiments. High-k dielectric layer 136 can include one or more of the high-k dielectric materials discussed above. In some embodiments, oxide layer 138 can have a thickness ranging from about 0.5 nm to about 1.5 nm (e.g., about 0.5 nm, about 1 nm, or about 1.5 nm) and high-k dielectric layer 136 can have a thickness ranging from about 1 nm to about 2 nm (e.g., about 1 nm, about 1.5 nm, or about 2 nm). In some embodiments, a ratio of the thickness of oxide layer 136 to the thickness of high-k dielectric layer 138 can be about 1:1.5. Other materials and formation methods for dielectric layer 102B are within the scope and spirit of this disclosure.

Metal layer 102C can be wrapped around semiconductor nanowire structure 162A. Metal layer 102C can be electrically isolated from first metal line 105-1 by dielectric layer 102B and can be electrically connected to a second metal line 105-2 of layer $M_{i-1}$ through a contact window 135 in dielectric layer 102B. Second metal line 105-2 can be adjacent to first metal line 105-1 of layer $M_{i-1}$. Metal layer 102C can include a single metal layer or a stack of metal layers. The stack of metal layers can include metals having work function values equal to or different from each other.

In some embodiments, metal layer 102C can include aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiA), titanium aluminum nitride (TiAlN), tungsten nitride (WN), metal alloys, and/or combinations thereof. In some embodiments, metal layer 102C can include Al-doped metal, such as Al-doped Ti, Al-doped TiN, Al-doped Ta, or Al-doped TaN. In some embodiments, metal layer 102C can include a stack of TiN layer and TiAl layer. In the stack, the TiN layer can be disposed on the TiA layer. Metal layer 102C can be formed using a suitable process such as ALD, CVD, PVD, plating, or combinations thereof. In some embodiments, metal layer 102C can have a thickness 102Ct ranging from about 3 nm to about 5 nm (e.g., about 3 nm, about 4 nm, or about 5 nm). Other materials, formation methods and thicknesses for metal layer 102C are within the scope and spirit of this disclosure. The isometric and cross-sectional views of IC structure 100 are shown for illustration purposes and may not be drawn to scale.

With voltage applied to metal layer 102C through contact window 135, conductive channel can be formed on the surface of semiconductor nanowire structure 102A and can electrically connect first BEOL interconnect structure 120 to second BEOL interconnect structure 140. Current can flow through semiconductor nanowire structure 102A along an Z-axis when voltage is applied to metal layer 102C. Metal layer 102C can function as a gate region of nanowire power switch device 102, which can be a junctionless transistor, to control the flow current through semiconductor nanowire structure 102A.

Figure 2B:
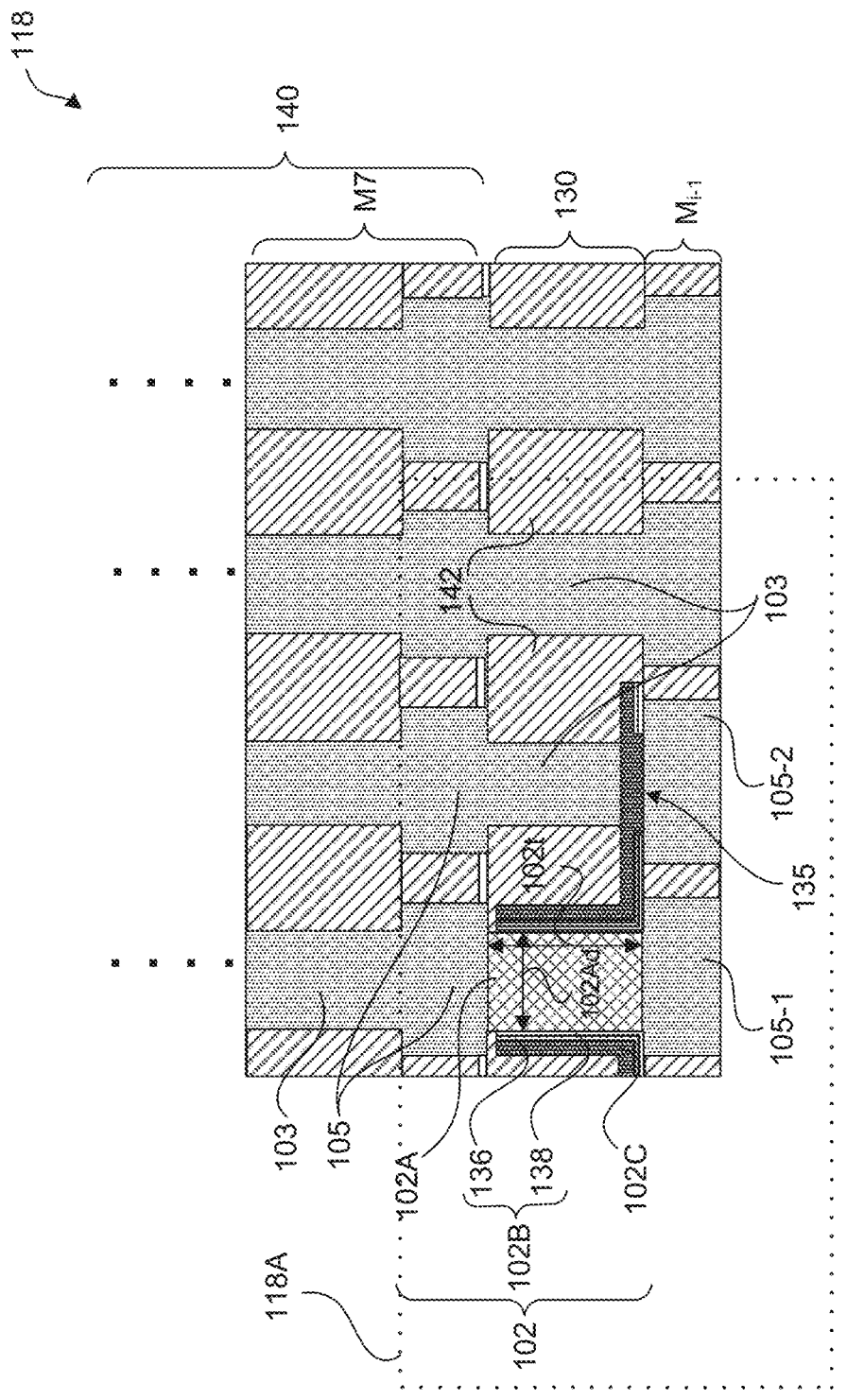

In some embodiments, a cross-sectional view of zoomed-in area 118 of IC structure 100 of FIG. 1 can be as shown in FIG. 2B. Metal layer 102C can function as a gate region of nanowire power switch device 102 and can be electrically coupled to second BEOL interconnect structure 140 through metal lines 105 and vias 103 as shown in FIG. 2B. In some embodiments, multiple layers of vias 103 and metal lines 105 can be coupled to metal layer 102C above contact window 135, as shown in FIG. 2B. In some embodiments, the multiple layers of vias 103 and metal lines 105 coupled to metal layer 102C above contact window 135 can be dummy vias and metal lines for placing and routing requirement.

Figure 3:
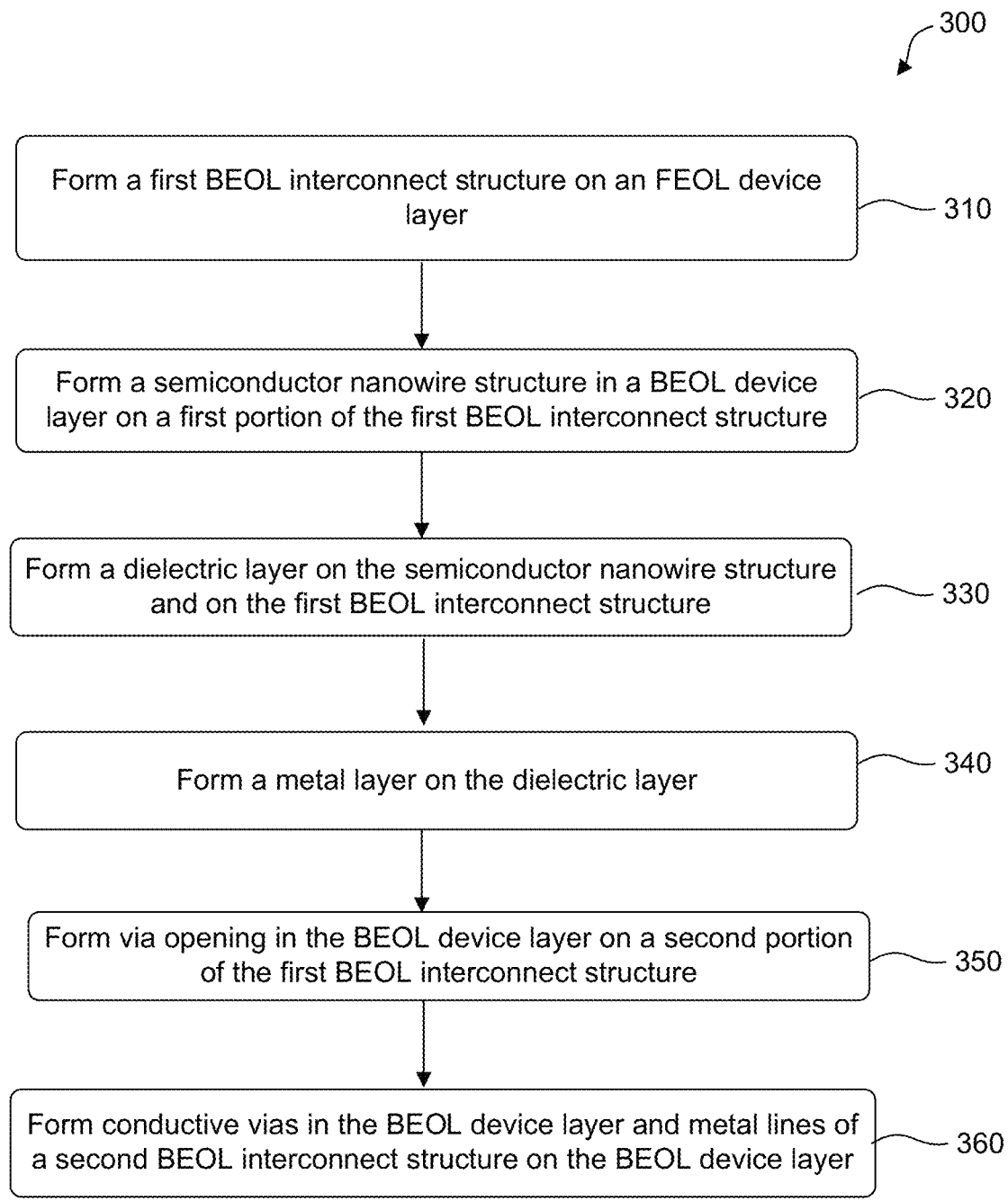
FIG. 3 illustrates a flow diagram of a method of forming an integrated circuit structure with a nanowire power switch device in an interconnect structure, in accordance with some embodiments.

FIG. 3 is a flow diagram of an example method 300 for fabricating IC structure 100, according to some embodiments. For the sake of clarity, the example method 300 describes the fabrication of a zoomed in area 118A (shown in FIG. 2) of IC structure 100. For illustrative purposes, the operations illustrated in FIG. 3 will be described with reference to the example fabrication process for fabricating the zoomed in area 118A of IC structure 100 as illustrated in FIGS. 4-8, 9A-11A, and 9B-11 B. FIGS. 9A-11A are isometric views of IC structure 100 at various stages of its fabrication, according to some embodiments. FIGS. 9B-11B are cross-sectional views along an X-axis, or lines B-B of respective structures of FIGS. 9A-11A, according to some embodiments. Operations can be performed in a different order or not performed depending on specific applications. It should be noted that method 300 may not produce a complete IC structure 100. Accordingly, it is understood that additional processes can be provided before, during, and after method 300, and that some other processes may only be briefly described herein. Elements in FIGS. 4-8, 9A-11A, and 9B-11B with the same annotations as elements in FIGS. 1-2 are described above.

In operation 310, a first BEOL interconnect structure is formed on an FEOL device layer, which has a plurality of active devices. For example, first BEOL interconnect structure 120 can be formed on FEOL device layer 110, which has a plurality of active devices 104 and control device 106 as described with reference to FIGS. 1-2 and 4. FIG. 4 shows the formation of layer $M_{i-1}$ of metal lines 105 of first BEOL interconnect structure 120 and not the other layers of metal lines 105 and vias 103 for the sake of clarity.

As shown in FIG. 4, layer $M_{i-1}$ can include metal lines 105 and intermetallic dielectric structures 134. Intermetallic dielectric structures 134 can be formed using undoped silica glass (USG), fluorinated silica glass (FSG), a low k material, an extremely low-k dielectric, other suitable materials, and/or combinations thereof. Extremely low-k dielectric material can have a dielectric constant much less than about 3.5 (e.g., about 3.4, about 3.0, about 2.7, about 2.5, or about 2). The extremely low-k material can include SiOC, SiCN, SiOCN, SiOCH, porous $SiO_2$, and/or a combination thereof. In some embodiments, thickness 134t of each intermetallic dielectric structures 134 can be in a range from about 50 nm to about 60 nm (e.g., about 50 nm, about 53 nm, about 55 nm, about 58 nm, or about 60 nm).

The formation of intermetallic dielectric structures 134 and metal lines 105 can include depositing a layer of intermetallic dielectric material on a layer of vias 103 (not shown) of first BEOL interconnect structure 102. Any suitable deposition process can be used, for example, PVD, CVD, ALD, molecular beam epitaxy (MBE), high density plasma CVD (HDPCVD), metal organic CVD (MOCVD), remote plasma CVD (RPCVD), plasma-enhanced CVD (PECVD), plating, other suitable methods, and/or combinations thereof. The deposition process can be followed by selective etching of the deposited layer of intermetallic dielectric material to form openings (not shown) that can be filled with conductive material in a subsequent process to form metal lines 105 electrically isolated from each other by intermetallic dielectric structures 134. The selective etching can be performed by dry etching. The conductive material of metal lines 105 can include aluminum (Al), copper (Cu), other suitable materials, and/or combinations thereof and can be deposited in the openings using CVD or other suitable metal deposition processes.

In some embodiments, a width 105w of each metal lines 105 along an X-axis can be in a range from about 10 nm to about 100 nm (e.g., about 10 nm, about 40 nm, about 60 nm, or about 100 nm). In some embodiments, a pitch 105p can be in a range from about 20 nm to about 200 nm (e.g., about 20 nm, about 50 nm, about 100 nm, about 150 nm, or about 200 nm). In some embodiments, a minimum value of pitch 105p can be at least about 76 nm for forming semiconductor nanowire structure 102A as described below.

Referring to FIG. 3, in operation 320, a semiconductor nanowire structure is formed in a BEOL device layer on a first portion of the first BEOL interconnect structure. For example, as shown in FIG. 4, semiconductor nanowire structure 102A can be formed in BEOL device layer 130 on a first metal line 105-1 of layer $M_{i-1}$ of first BEOL interconnect structure 120. The formation of semiconductor nanowire structure 102A can include blanket depositing a layer of amorphous Si or amorphous $Si_{1-x}Ge_x$ (not shown), wherein a value of x can be from zero to one, on layer $M_{i-1}$ with in-situ doping. The deposition of the layer of amorphous Si or amorphous $Si_{1-x}Ge_x$ can include chemical vapor deposition (CVD), physical vapor deposition (PVD), or other suitable deposition processes. In some embodiments, the in-situ doping can include doping the layer of amorphous Si or amorphous $Si_{1-x}Ge_x$ with one or more p-type dopant, for example, boron (B), aluminum (Al), and/or gallium (Ga) or with one or more n-type dopants, for example, phosphorus (P), arsenic (As), and/or antimony (Sb). In some embodiments, the in-situ doping can include doping the layer of amorphous Si or amorphous $Si_{1-x}Ge_x$ with a dopant concentration ranging from about $1 \times 10^{19}$ atoms/$cm^3$ to about $1 \times 10^{20}$ atoms/$cm^3$ (e.g., about $1 \times 10^{19}$ atoms/$cm^3$, about $3 \times 10^{19}$ atoms/$cm^3$, about $5 \times 10^{19}$ atoms/$cm^3$, about $8 \times 10^{19}$ atoms/$cm^3$, or about $1 \times 10^{20}$ atoms/$cm^3$).

The deposition and in-situ doping process can be followed by an anneal process to re-crystalize the deposited layer of amorphous Si or amorphous $Si_{1-x}Ge_x$, respectively to polysilicon or $Si_{1-x}Ge_x$ In some embodiments, the anneal process can include a laser anneal for about few nanoseconds (ns). In some embodiments, the laser anneal can be a green laser anneal at a power of about 50 W to 200 W (e.g., about 50 W, about 100 W, or about 200 W) for about 1 ns to about 9 ns (e.g., about 1 ns, about 3 ns, about 5 ns, about 7 ns, or about 9 ns). The re-crystalized layer of polysilicon or $Si_{1-x}Ge_x$ can have a vertical dimension along a Z-axis ranging from about 50 nm to about 60 nm (e.g., about 50 nm, about 55 nm, about 57 nm, or about 60 nm).

The anneal process of the layer of amorphous Si or amorphous $Si_{1-x}Ge_x$ can be followed by patterning and etching of the re-crystalized layer of polysilicon or $Si_{1-x}Ge_x$ to form semiconductor nanowire structure 102A, as shown in FIG. 4. A masking layer (not shown) can be formed on the re-crystalized layer of polysilicon or $Si_{1-x}Ge_x$ and patterned to protect regions of semiconductor nanowire structure 102A during the etching process. The masking layer can be patterned such that nominal dimensions such as diameter of semiconductor nanowire structure 102A can be achieved through the patterning and etching. Composition of the masking layer can include a photoresist, a hard mask, and/or other suitable materials. Examples of hard mask can include silicon nitride, silicon oxide, and/or other suitable materials. The patterning process can include forming the masking layer over the re-crystalized layer of polysilicon or $Si_{1-x}Ge_x$, exposing the resist to a pattern, performing post-exposure bake processes, and developing the resist to form a masking element consisting of the photoresist. The masking element can then be used to protect regions of semiconductor nanowire structure 102A in the re-crystalized layer of polysilicon or $Si_{1-x}Ge_x$.

In some embodiments, etching of the re-crystalized layer of polysilicon or $Si_{1-x}Ge_x$ can include a dry etching process, a wet etching process, or a combination thereof. The dry etching process can include using etchants having a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), other suitable etching gases and/or plasmas, an inert gas (e.g., He, Ne, and/or Ar), or combinations thereof. In some embodiments, a ratio between inert gas and etching gas, for example, Ar and HBr, respectively, can be in a range from about 1:1.5 to about 1:2 (e.g., about 1:1.5, about 1:1.7, or about 1:2). After the etching process, semiconductor nanowire structure 102A can be formed with a diameter 102Ad ranging from about 20 nm to about 30 nm (e.g., about 20 nm, about 25 nm, about 28 nm, or about 30 nm). A vertical dimension 102t (e.g., height) of semiconductor nanowire structure 102A can be the same as the vertical dimension of the re-crystallized layer of polysilicon or $Si_{1-x}Ge_x$ layer and can be in a range from about 50 nm to about 60 nm (e.g., about 50 nm, about 55 nm, about 57 nm, or about 60 nm).

Referring to FIG. 3, in operation 330, a dielectric layer is formed on the semiconductor nanowire structure and on the first BEOL interconnect structure. For example, as shown in FIG. 5, a dielectric layer 102B* can be formed on semiconductor nanowire structure 102A and on layer $M_{i-1}$ of first BEOL interconnect structure 120. In subsequent processing, dielectric layer 102B* can form dielectric layer 102B of nanowire power switch device 102 as described above with reference to FIG. 2. The formation of dielectric layer 102B* can include blanket depositing an oxide layer 138* on the structure of FIG. 4, followed by a blanket deposition of a high-k dielectric layer 136* on oxide layer 138*. The oxide layer 138* can be blanket deposited using CVD, PVD, ALD, or other suitable processes and high-k dielectric layer 136* can be blanket deposited using ALD. Oxide layer 138* can have a thickness ranging from about 0.5 nm to about 1.5 nm (e.g., about 0.5 nm, about 1 nm, or about 1.5 nm). High-k dielectric layer 136* can have a thickness ranging from about 1 nm to about 2 nm (e.g., about 1 nm, about 1.5 nm, or about 2 nm). In some embodiments, a ratio of the thickness of oxide layer 136* to the thickness of high-k dielectric layer 138* can be about 1:1.5. In subsequent processing, oxide layer 138* and high-k dielectric layer 136* can form oxide layer 138 and high-k dielectric layer 136, respectively, of dielectric layer 102B as described above with reference to FIG. 2.

The formation of dielectric layer 102B* can be followed by patterning and etching of dielectric layer 102B* to form contact window 135 on second metal line 105-2 of layer $M_{i-1}$ of first BEOL interconnect structure 120. Second metal line 105-2 can be adjacent to first metal line 105-1 and electrically isolated from first metal line 105 by an intermetallic dielectric structure 134 of layer $M_{i-1}$. A masking layer can be formed on dielectric layer 102B* and patterned to open contact window 135 during the etching process. The patterning and etching processes can be similar to that described above for the formation of semiconductor nanowire structure 102A with reference to FIG. 4. In some embodiments, the etching of dielectric layer 102B* can include a dry etching process, a wet etching process, or a combination thereof. The dry etching process can include using etchants having a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, $SiCl_4$, and/or $BCl_3$), a bromine-containing gas (e.g., HBr and/or $CHBR_3$), other suitable etching gases and/or plasmas, or combinations thereof. In some embodiments, a ratio between etching gases, for example $SiCl_4$ and $BCl_3$, can be in a range from about 1:2 to about 1:2.5 (e.g., about 1:2, about 1:2.2, or about 1:2.5). After the etching process, contact window 135 can be formed on second metal line 105-2 with a width 135w ranging about 20 nm to about 30 nm (e.g., about 20 nm, about 25 nm, about 28 nm, or about 30 nm).

Figure 7:
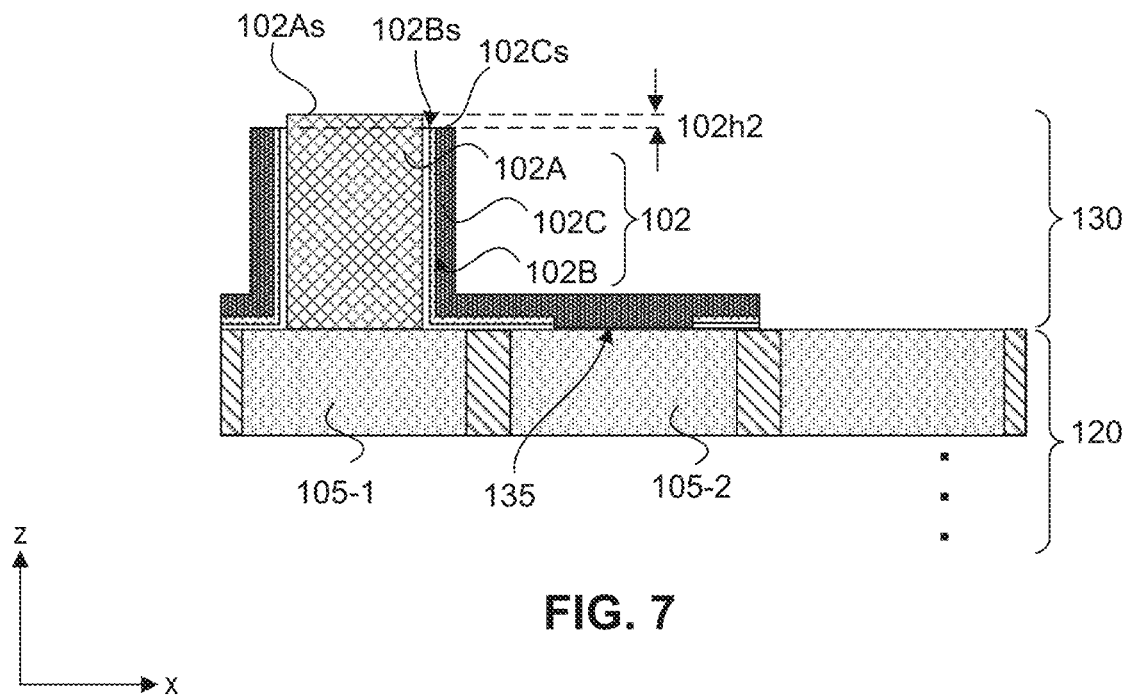

Referring to FIG. 3, in operation 340, a metal layer is formed on the dielectric layer. For example, as shown in FIGS. 6-7, dielectric layer 102B can formed and metal layer 102C can be formed on dielectric layer 102B. Also, metal layer 102C can be electrically connected to second metal line 105-2 through contact window 135 in dielectric layer 102B and can be electrically isolated from first metal line 105-1 by dielectric layer 102B. The formation of metal layer 102C can include deposition of a metal layer 102C* followed by patterning and etching of metal layer 102C*. Metal layer 102C* can be deposited have a stack of metal layers, for example, TiN layer and TiAl layer and can be deposited using a suitable process such as ALD, CVD, PVD, plating, or combinations thereof. Metal layer 102C* can have a thickness 102Ct ranging from about 3 nm to about 5 nm (e.g., about 3 nm, about 4 nm, or about 5 nm).

A masking layer 137 can be formed and patterned over metal layer 102C* using photolithography as shown in FIG. 6. In some embodiments, masking layer 137 can be etched back. The etching back of masking layer 137 can include a dry etching process, a wet etching process, or a combination thereof. The dry etching process can include using etchants having a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), other suitable etching gases and/or plasmas, an inert gas (e.g., He, Ne, and/or Ar), or combinations thereof. In some embodiments, a ratio between inert gas and etching gas, such as Ar and CF4, respectively, can be in a range from about 1:1 to about 1:1.5 (e.g., about 1:1, about 1:1.2, or about 1:1.5). After the etching back process, a distance 102h1 from a top surface 137s of masking layer 137 to a top surface 102Cs* of metal layer 102C* can be in a range from about 10 nm to about 12 nm (e.g., about 10 nm, about 11 nm, or about 12 nm).

The etching back of masking layer 137 can be followed by etching of metal layer 102C* and dielectric layer 102B* to form respective metal layer 102C and dielectric layer 102B as shown in FIG. 7. In some embodiments, the etching of metal layer 102C* and dielectric layer 102B* can include a dry etching process, a wet etching process, or a combination thereof. The dry etching process can include using etchants having a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, $SiCl_4$, and/or $BCl_3$), a bromine-containing gas (e.g., HBr and/or $CHBR_3$), other suitable etching gases and/or plasmas, or combinations thereof. In some embodiments, a ratio between etching gases, for example $Cl_2$ and $BCl_3$, can be in a range from about 1:1.5 to about 1:2 (e.g., about 1:1.5, about 1:1.8, or about 1:2). After the etching process, a distance 102h2 between a top surface 102As of semiconductor nanowire structure 102A and top surfaces 102Cs and 102Bs of respective metal layer 102C and dielectric layer 102B on the sidewall of semiconductor nanowire structure 102A can be in a range from about 3 nm to about 5 nm (e.g., about 3 nm, about 4 nm, or about 5 nm). According to some embodiments, height 102h2 can prevent electrical shorting between metal layer 102C and an overlying conductive interconnect structure (e.g., second BEOL interconnect structure 140 shown in FIG. 2).

According to some embodiments, metal layer 102C, dielectric layer 102B, and semiconductor nanowire structure 102A can form a nanowire power switch device 102, which can be gate controlled through metal layer 102C. With voltage (e.g., gate voltage VG) applied to metal layer 102C through contact window 135, conductive channel can be formed on the surface of semiconductor nanowire structure 102A and can electrically connect conductive interconnect structures underlying (e.g., first BEOL interconnect structure 120) semiconductor nanowire structure 102A to conductive interconnect structures overlying (e.g., second BEOL interconnect structure 140) semiconductor nanowire structure 102A. Current can flow through semiconductor nanowire structure 102A along an Z-axis when voltage is applied to metal layer 102C. Metal layer 102C can function as a gate region of nanowire power switch device 102, which can be a junctionless transistor, to control the flow current through semiconductor nanowire structure 102A.

Figure 8:
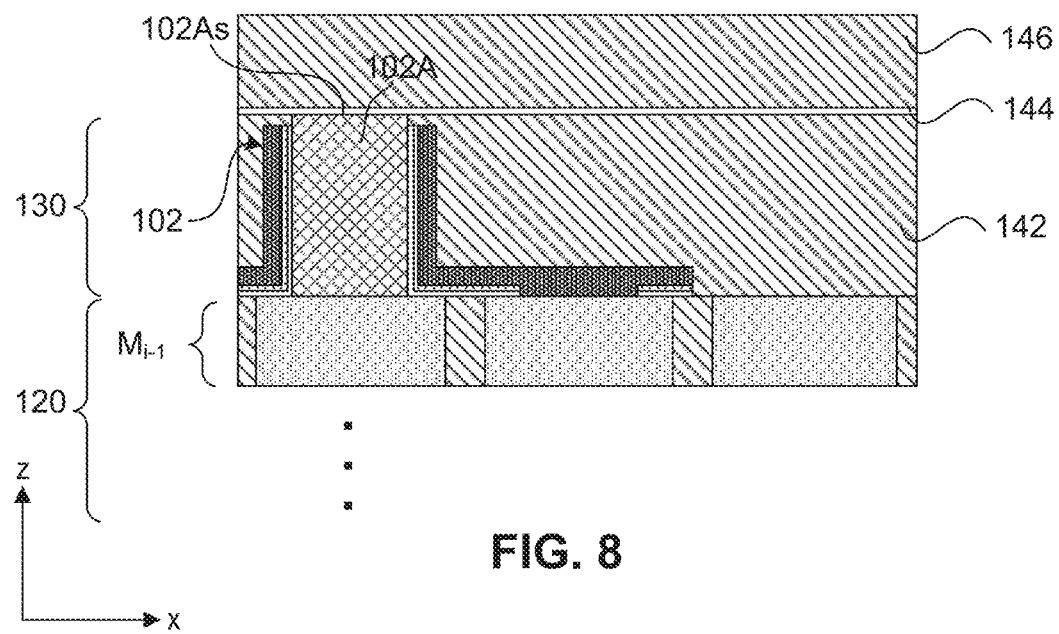

Referring to FIG. 3, in operation 350, via openings are formed in the BEOL device layer on the first BEOL interconnect structure. For example, as shown in FIGS. 8-9, a via opening 148 can be formed in BEOL device layer 130. In subsequent processing, via opening 148 can form conductive via 103 of BEOL device layer 130 as described with reference to FIGS. 1-2. The formation of via opening 148 can include blanket deposition of dielectric layer 142 on the structure of FIG. 7, followed by a chemical mechanical polishing (CMP) to expose top surface 102As of semiconductor nanowire structure 102A. Dielectric layer 142 can be formed using undoped silica glass (USG), fluorinated silica glass (FSG), a low k material, an extremely low-k dielectric material, other suitable materials, and/or combinations thereof. Extremely low-k dielectric material can have a dielectric constant less than about 3.5 (e.g., about 3.5, about 3.0, about 2.7, about 2.5, or about 2). The extremely low-k material can include SiOC, SiCN, SiOCN, SiOCH, porous $SiO_2$, and/or a combination of. Any suitable deposition process can be used to form dielectric layer 142, for example, PVD, CVD, ALD, molecular beam epitaxy (MBE), high density plasma CVD (HDPCVD), metal organic (MOCVD), remote plasma CVD (RPCVD), plasma-enhanced CVD (PECVD), other suitable methods, and/or combinations thereof. In some embodiments, dielectric layer 142 can be deposited using CVD at a temperature less than 400° C. (e.g., in a range from about 200° C. to about 390° C., about 250° C., about 300° C., about 350° C., or about 380° C.). A vertical dimension (e.g., thickness) of dielectric layer 142 along a Z-axis can be in a range from about 50 nm to about 60 nm (e.g., about 50 nm, about 53 nm, about 55 nm, about 58 nm, or about 60 nm).

The formation of dielectric layer 142 can be followed by a deposition of an etch stop layer (ESL) 144 and a dielectric layer 146. In some embodiments, ESL 144 can include, for example, silicon nitride ($SiN_x$), silicon oxide ($SiO_x$), silicon oxynitride (SiON), silicon carbide (SiC), silicon carbonitride (SiCN), boron nitride (BN), silicon boron nitride (SiBN), silicon carbon boron nitride (SiCBN), or a combination thereof. In some embodiments, ESL 144 can include silicon nitride or silicon oxynitride formed by plasma enhanced chemical vapor deposition (PECVD), low pressure chemical vapor deposition (LPCVD), CVD, or silicon oxide formed by a high-aspect-ratio process (HARP). In some embodiments, ESL 144 can be deposited using PECVD at a temperature in a range from about 400° C. to about 475° C. (e.g., about 400° C., about 450° C., about 460° C., or about 475° C.). In some embodiments, ESL 144 can have a thickness ranging from about 3 nm to about 5 nm (e.g., about 3 nm, about 4 nm, about 4.5 nm, or about 5 nm). Other materials, formation methods, and thicknesses for ESL 144 are within the scope and spirit of this disclosure.

Dielectric layer 146 can be deposited with same material and/or same method as dielectric layer 142, or with a different dielectric material and/or method from dielectric layer 142. In some embodiments, dielectric layer 146 can be deposited using CVD at a temperature less than 400° C. (e.g., in a range from about 200° C. to about 390° C., about 250° C., about 300° C., about 350° C., or about 380° C.). In some embodiments, dielectric layer 146 can have a vertical dimension (e.g., thickness) along a Z-axis ranging from about 30 nm to about 40 nm (e.g., about 30 nm, about 33 nm, about 35 nm, about 37 nm, or about 40 nm).

Figure 9A:
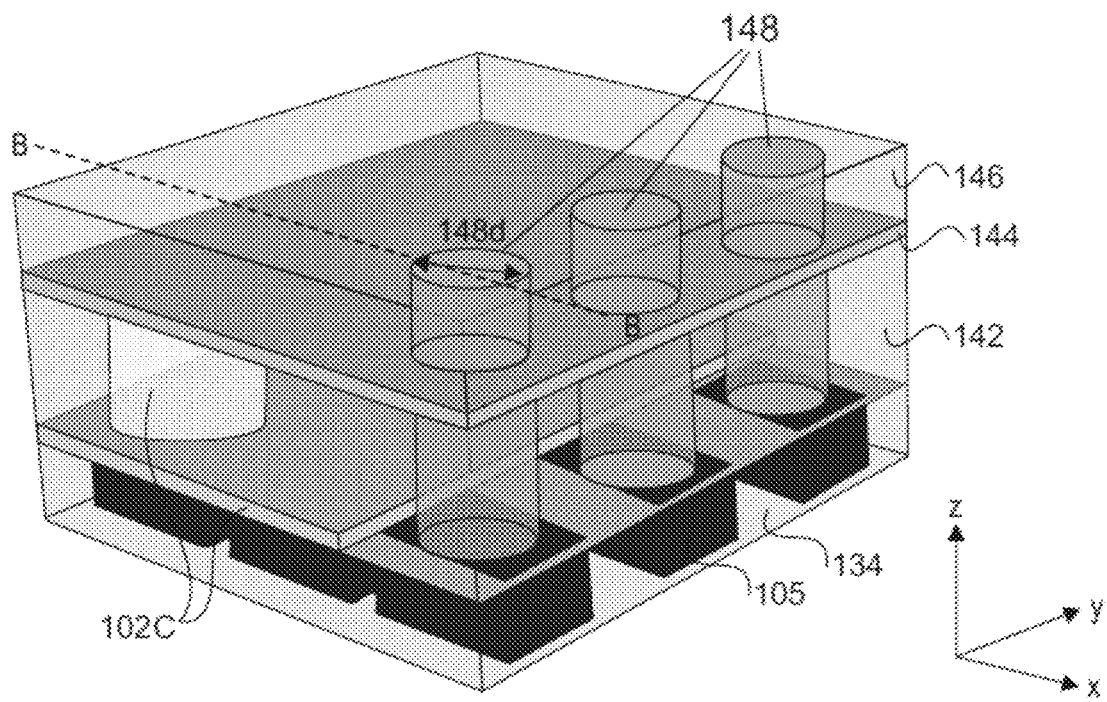
Figure 9B:
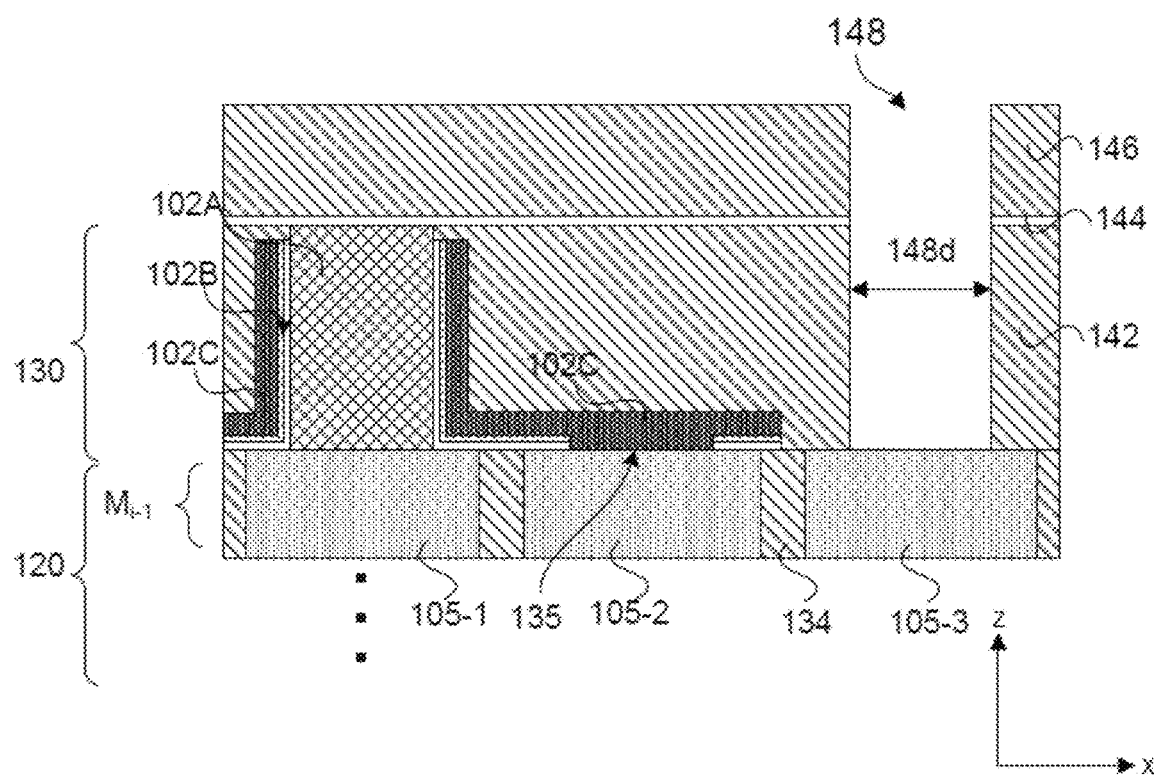

The formation of dielectric layer 146 can be followed by the formation of via openings 148 as shown in FIGS. 9A-9B. FIG. 9A illustrates an isometric view of the structure in FIG. 9B and FIG. 9B illustrates a cross-sectional view along line B-B of FIG. 9A. Via openings 148 can be formed in second dielectric layer 142, ESL 144, and third dielectric layer 146 on a third metal line 105-3 of layer $M_{i-1}$ of first BEOL interconnect structure 120. Third metal line 105-3 can be adjacent to second metal line 105-2 and can be electrically isolated from second metal line 105-2 by an intermetallic dielectric structure 134 of layer $M_{i-1}$.

Via openings 148 can be formed by patterning and etching of dielectric layer 146, ESL 144, and dielectric layer 142. In some embodiments, the etching of dielectric layer 146, ESL 144, and dielectric layer 142 can include a dry etching process. The dry etching process can include using etchants having a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), other suitable etching gases and/or plasmas, or combinations thereof. In some embodiments, a ratio between etching gases, for example $CH_2F_2$ and $CF_4$, can be in a range from about 1:2 to about 1:2.5 (e.g., about 1:2 about 1:2.2, about 1:2.4, or about 1:2.5). After the etching process, via openings 148 can have a diameter 148d ranging from about 20 nm to about 30 nm (e.g., about 20 nm, about 25 nm, about 28 nm, or about 30 nm).

In some embodiments, via opening similar to via opening 148 can be additionally formed by patterning and etching portions of dielectric layer 146, ESL 144, and dielectric layer 142 on metal layer 102C above contact window 135 to subsequently form vias 103 and metal lines 105 as shown in FIG. 2B.

Referring to FIG. 3, in operation 360, conductive vias are formed in the BEOL device layer and metal lines of a second BEOL interconnect structure are formed on the BEOL device layer. For example, as illustrated in FIGS. 10A-11B, metal lines 105 of second BEOL interconnect structure 140 can be formed on second dielectric layer 142 and semiconductor nanowire structure 102A. FIGS. 10A-11A illustrate isometric views of the structures in FIGS. 10B-11B, respectively, and FIGS. 10B-11B illustrate cross-sectional views along lines B-B of FIGS. 10A-11A, respectively.

Figure 10A:
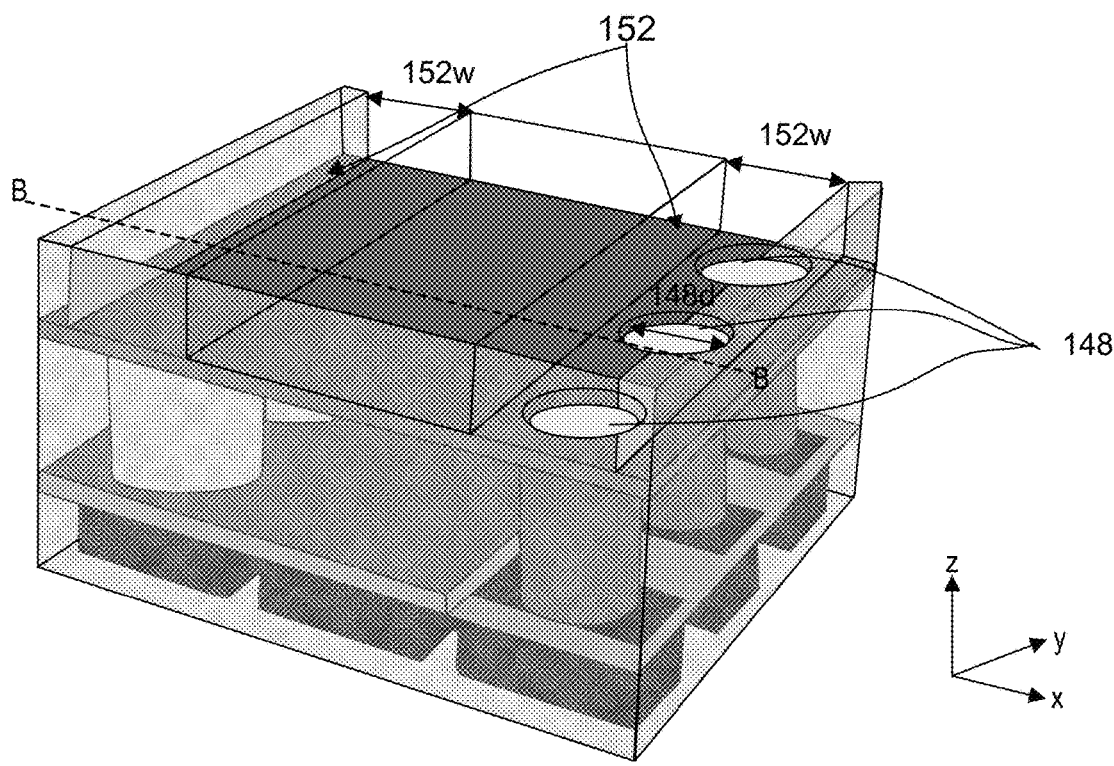
Figure 10B:
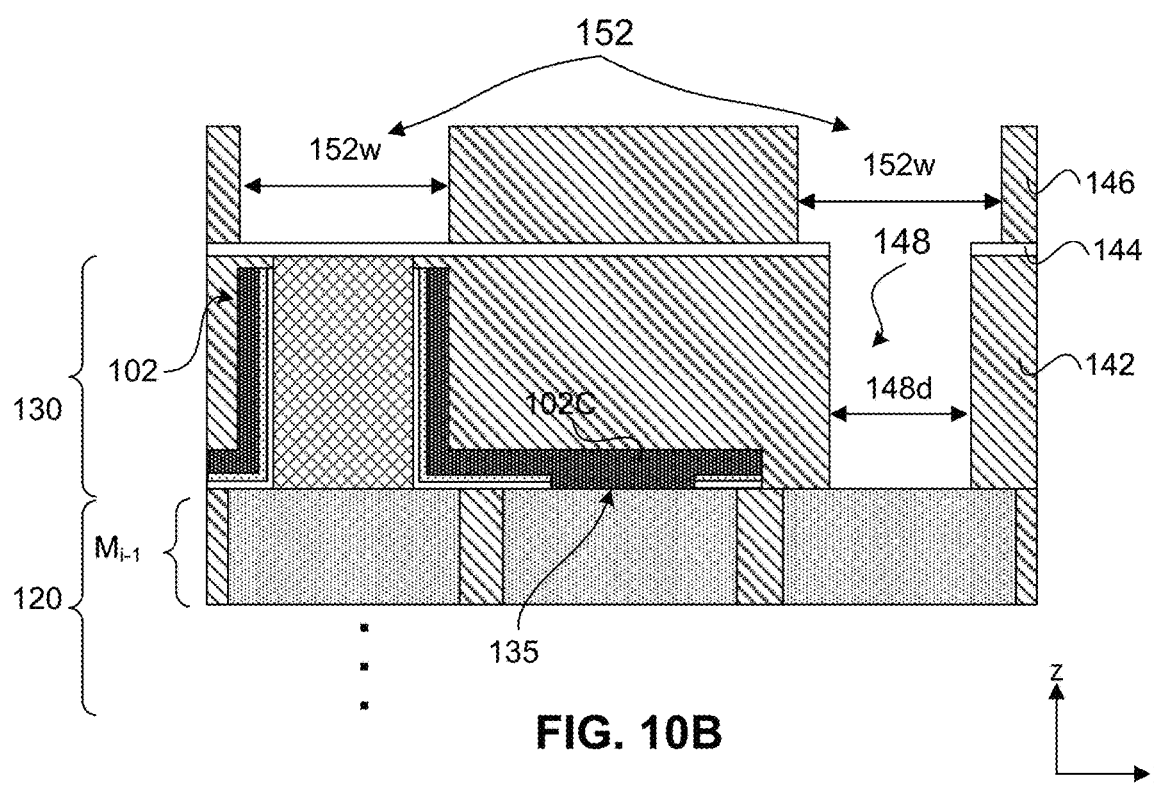
Figure 11A:
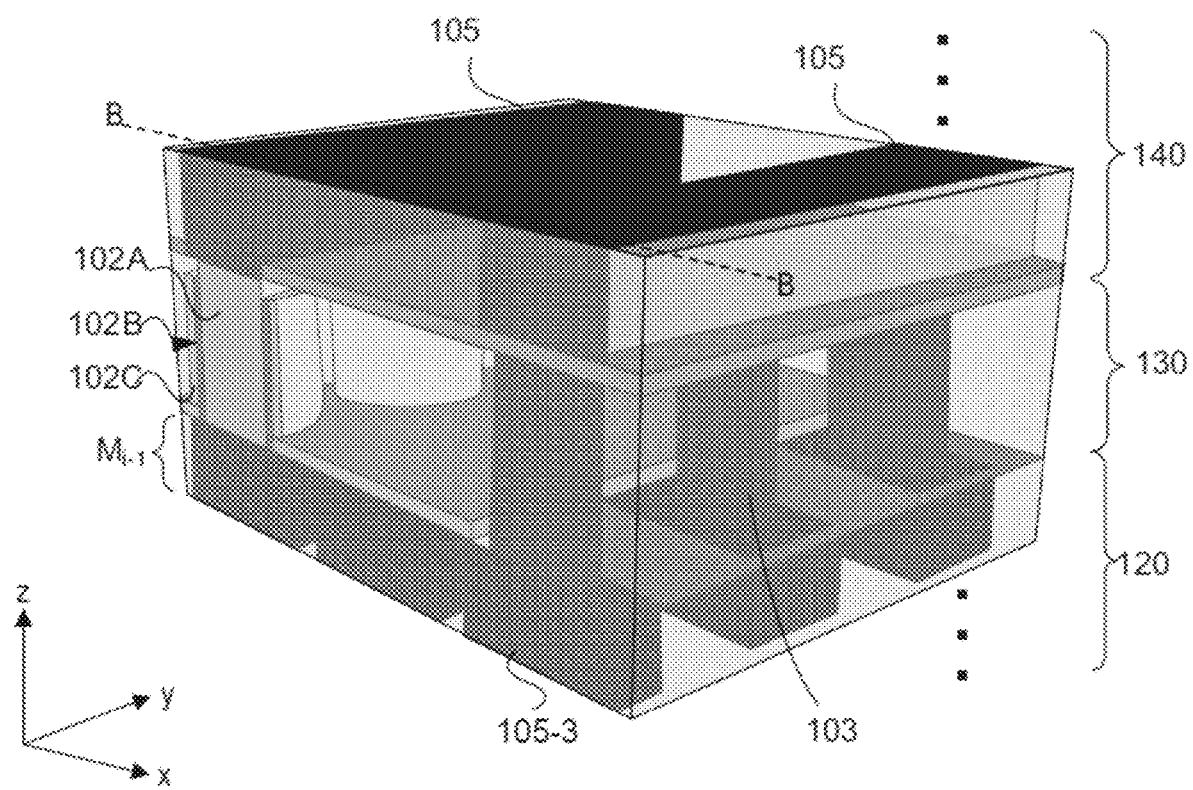
Figure 11B:
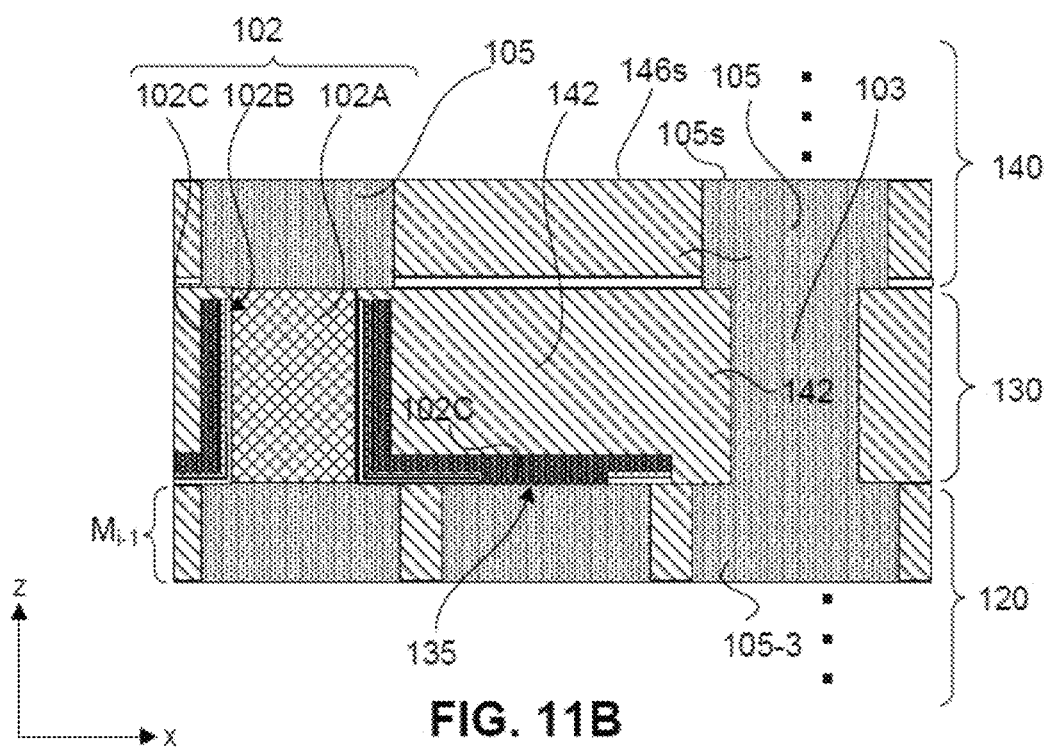

The formation of metal lines 105 of second BEOL interconnect structure 140 can include formation of trench openings 152, as shown in FIGS. 10A-10B. The formation of trench openings 152 can include patterning and selective etching of dielectric layer 146. In some embodiments, the selective etching of dielectric layer 146 can include a dry etching process. The dry etching process can include using etchants $CH_2F_2$ and $CF_4$, with ratio in a range from about 1:2 to about 1:2.5 (e.g., about 1:2 about 1:2.2, about 1:2.4, or about 1:2.5). During the dry etching process, ESL 144 can protect dielectric layer 142 under ESL 144 from etching and widening via openings 148. After the selective etching of dielectric layer 146, trench openings 152 can have a horizontal dimension 152w (e.g., width) along an X-axis ranging from about 40 nm to about 60 nm (e.g., about 40 nm, about 45 nm, about 50 nm, or about 60 nm). Trench openings 152 can be wider than via openings 148 along an X-axis. During subsequent processing, as illustrated in FIGS. 11A-11B, ESL 144 can be removed. In some embodiments, the removal of ESL 144 can include a wet etching process. The wet etching process can include using etchants having phosphoric acid.

The removal of ESL 144 can be followed by metal plating to fill via openings 148 and trench openings 152, followed by CMP to coplanarize top surfaces 146s and 105s of dielectric layer 146 and metal lines 105, respectively, to form the structure of FIGS. 11A-11B. The conductive material for metal plating can include Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof. The metal filled via openings 148 can form conductive vias 103 of BEOL device layer 103 and the metal filled trench openings 152 can form metal lines 105 of second BEOL interconnect structure 140.

In some embodiments, trench opening similar to trench openings 152 can be additionally formed by patterning and selective etching portions of dielectric layer 146 on metal layer 102C above contact window 135 followed by metal plating to fill the via and trench openings on metal layer 102C above contact window 135 to form vias 103 and metal lines 105 as shown in FIG. 2B.

Further processing can form one or more conductive interconnect layers of second conductive interconnect structure 140 on BEOL device layer 130. Second BEOL interconnect structure 140 can be further connected to a power source. The power source can be configured to provide power to the plurality of active devices 104 through semiconductor nanowire structure 102A controlled by metal layer 102C.

The present disclosure provides example IC structures 100 with nanowire power switch devices 102 in BEOL interconnect structures and example methods of fabricating the same. In some embodiments, an IC structure 100 can include first and second BEOL interconnect structures 120 and 140 and a nanowire power switch device 102 in a BEOL device layer 130 interposed between the first and second BEOL interconnect structures 120 and 140. The first interconnect BEOL structure 120 can be electrically connected to a plurality of active devices (e.g., FET devices) in an FEOL device layer 110 through low-level interconnect structures in the MEOL portion.

The nanowire power switch device 102 can include a semiconductor nanowire structure 102A, a dielectric layer 102B wrapped around the semiconductor nanowire structure 102A, and a metal layer 102C disposed on the dielectric layer 102B. The semiconductor nanowire structure 102A and the metal layer 102C can be electrically connected to different metal lines of the first BEOL interconnect structure 120. The second BEOL interconnect structure 140 can be connected to a power source, which can provide power to the plurality of active devices through the semiconductor nanowire structure 102A under the control of the metal layer 102C.

Integrating the nanowire power switch devices, such as nanowire power switch device 102 in the BEOL interconnect structures can reduce power switch device areas in the FEOL portion, thus improving logic device density in the FEOL portion, in accordance with some embodiments. Also, short channel performance of the nanowire power switch devices can be improved without BEOL area penalty. Fast switching speed can also be achieved in the nanowire power switch devices because of the junctionless device formed with the semiconductor nanowire structure.

In some embodiments, a method of forming an integrated circuit (IC) structure includes forming a first layer of metal lines of a first back end of line (BEOL) interconnect structure and forming a semiconductor nanowire structure on a first metal line of the first layer of metal lines of the first BEOL interconnect structure. The BEOL interconnect structure is formed on a front end of line (FEOL) device layer having multiple active devices. The method further includes forming a first dielectric layer wrapped around the semiconductor nanowire structure, forming a metal layer on the dielectric layer and on a second metal line of the first layer of metal lines of the first BEOL interconnect structure, and forming a second layer of metal lines of a second BEOL interconnect structure on the semiconductor nanowire structure. The first and second metal lines are electrically isolated from each other.

In some embodiments, a method of forming a semiconductor interconnect structure includes forming a back end of line (BEOL) device layer on a first layer of metal lines of a first back end of line (BEOL) interconnect structure and forming a second layer of metal lines of a second BEOL interconnect structure on the semiconductor nanowire structure. The forming the BEOL device layer further includes forming a nanowire power switch device, a conductive via, and a first dielectric layer that electrically isolates the nanowire power switch device from the conductive via. The forming the nanowire power switch device further includes forming a nanowire structure on a first metal line of the first layer of metal lines of the first BEOL interconnect structure.

In some embodiments, an integrated circuit (IC) structure includes a first layer of metal lines of a first back end of line (BEOL) interconnect structure and a semiconductor nanowire structure disposed on a first metal line of the first layer of metal lines of the first BEOL interconnect structure. The BEOL interconnect structure is disposed on a front end of line (FEOL) device layer having a plurality of active devices. The IC structure further includes a first dielectric layer wrapped around the semiconductor nanowire structure, a metal layer disposed on the dielectric layer and on a second metal line of the first layer of metal lines of the first BEOL interconnect structure and the second layer of metal lines of a second BEOL interconnect structure disposed on the semiconductor nanowire structure. The first and second metal lines are electrically isolated from each other;

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method for forming an integrated circuit (IC) structure, the method comprising:
   forming a first layer of metal lines of a first back end of line (BEOL) interconnect structure, wherein the BEOL interconnect structure is formed on a front end of line (FEOL) device layer having a plurality of active devices;
   forming a semiconductor nanowire structure on a first metal line of the first layer of metal lines of the first BEOL interconnect structure;
   forming a first dielectric layer wrapped around the semiconductor nanowire structure;
   forming a metal layer on the first dielectric layer and in direct contact with a second metal line of the first layer of metal lines of the first BEOL interconnect structure, wherein the first and second metal lines are electrically isolated from each other; and forming a second layer of metal lines of a second BEOL interconnect structure on the semiconductor nanowire structure.

2. The method of claim 1, wherein the forming the semiconductor nanowire structure comprises:

blanket depositing a layer of semiconductor material on the first metal line and the second metal line of the first layer of metal lines;

doping the layer of semiconductor material; and etching the layer of semiconductor material to retain a portion of the layer of semiconductor material on the first metal line of the first layer of metal lines and to remove a portion of the layer of semiconductor material on the second metal line of the first layer of metal lines.

3. The method of claim 1, wherein the forming the first dielectric layer comprises:

depositing a layer of oxide material wrapped around the semiconductor nanowire structure and on the second metal line; and depositing a layer of high-k dielectric material on the layer of oxide material.

4. The method of claim 3, wherein the forming the metal layer comprises:

forming an opening in portions of the layers of oxide material and high-k dielectric material on the second metal line;

depositing a layer of metal on the layer of high-k dielectric material and in the opening; and etching portions of the layer of metal on a top surface of the semiconductor nanowire structure.

5. The method of claim 1, wherein the forming the first dielectric layer comprises:

blanket depositing a layer of oxide material on the semiconductor nanowire structure and the second metal line and a third metal line of the first layer of metal lines; and blanket depositing a layer of high-k dielectric material on the layer of oxide material.

6. The method of claim 5, wherein the forming the first dielectric layer further comprises:

etching first portions of the layers of oxide material and high-k dielectric material on the second metal line; and etching second portions of the layers of oxide material and high-k dielectric material on a top surface of the semiconductor nanowire structure.

7. The method of claim 1, further comprising forming conductive vias on a third metal line of the first layer of metal lines of the first BEOL interconnect structure.

8. The method of claim 7, wherein the forming the second layer of metal lines of the second BEOL interconnect structure comprises forming first and second metal lines of the second layer of metal lines on the semiconductor nanowire structure and on at least one of the conductive vias.

9. The method of claim 1, wherein the forming the semiconductor nanowire structure comprises forming the semiconductor nanowire structure with a diameter ranging from about from about 20 nm to about 30 nm.

10. A method for forming a semiconductor interconnect structure, the method comprising:

forming a back end of line (BEOL) device layer on a first layer of metal lines of a first back end of line (BEOL) interconnect structure, wherein the forming the BEOL device layer comprises forming a nanowire power switch device, a conductive via, and a first dielectric layer that electrically isolates the nanowire power switch device from the conductive via, and wherein the forming the nanowire power switch device comprises forming a semiconductor nanowire structure on a first metal line of the first layer of metal lines of the first BEOL interconnect structure; and forming a second layer of metal lines of a second BEOL interconnect structure on the semiconductor nanowire structure.

11. The method of claim 10, wherein the forming the nanowire power switch device further comprises:

forming a second dielectric layer wrapped around the semiconductor nanowire structure; and forming a metal layer on the second dielectric layer.

12. The method of claim 11, wherein the forming the second dielectric layer comprises:

depositing a layer of oxide material on the semiconductor nanowire structure and on a second metal line of the first layer of metal lines; and depositing a layer of high-k dielectric material on the layer of oxide material.

13. The method of claim 12, wherein the forming the metal layer comprises:

forming an opening in portions of the layers of oxide material and high-k dielectric material on the second metal line;

depositing a layer of metal on the layer of high-k dielectric material and in the opening; and etching portions of the layer of metal on a top surface of the semiconductor nanowire structure.

14. The method of claim 12, wherein the forming the conductive via comprises:

depositing a layer of dielectric material on the nanowire power switch device;

forming an opening in portions of the layer of dielectric material on a third metal line of the first layer of metal lines, wherein the first, second, and third metal lines are electrically isolated from each other; and depositing a layer of metal to fill the opening.

15. The method of claim 10, wherein the forming the nanowire power switch device further comprises forming a metal layer on a second metal line of the first layer of metal lines, wherein the first and second metal lines are electrically isolated from each other.

16. The method of claim 10, wherein the forming the semiconductor nanowire structure comprises forming the semiconductor nanowire structure with a diameter ranging from about from about 20 nm to about 30 nm.

17. An integrated circuit (IC) structure, comprising:

a first layer of metal lines of a first back end of line (BEOL) interconnect structure, wherein the first BEOL interconnect structure is disposed on a front end of line (FEOL) device layer having a plurality of active devices;

a semiconductor nanowire structure disposed on a first metal line of the first layer of metal lines of the first BEOL interconnect structure;

a first dielectric layer wrapped around the semiconductor nanowire structure;

a metal layer disposed on the first dielectric layer and in direct contact with a second metal line of the first layer of metal lines of the first BEOL interconnect structure, wherein the first and second metal lines are electrically isolated from each other; and a second layer of metal lines of a second BEOL interconnect structure disposed on the semiconductor nanowire structure.

18. The IC structure of claim 17, further comprising a conductive via on same plane of the semiconductor nanowire structure, wherein the conductive via is disposed on a third metal line of the first layer of metal lines and wherein the first, second, and third metal lines are electrically isolated from each other.

19. The IC structure of claim 17, wherein the metal layer, wrapped around the semiconductor nanowire structure and separated from the semiconductor nanowire structure by the first dielectric layer, is configured to control current flow through the semiconductor nanowire structure.

20. The IC structure of claim 17, wherein the semiconductor nanowire structure has a diameter ranging from about from about 20 nm to about 30 nm.

* * * * *